(12) United States Patent
Capelli et al.

(10) Patent No.: US 11,796,926 B2
(45) Date of Patent: Oct. 24, 2023

(54) METROLOGY SYSTEM FOR EXAMINING OBJECTS WITH EUV MEASUREMENT LIGHT

(71) Applicant: Carl Zeiss SMT GmbH, Oberkochen (DE)

(72) Inventors: Renzo Capelli, Heidenheim (DE); Klaus Gwosch, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/992,034

(22) Filed: Nov. 22, 2022

(65) Prior Publication Data

US 2023/0168593 A1    Jun. 1, 2023

(30) Foreign Application Priority Data

Nov. 26, 2021   (DE) .......................... 102021213327.4

(51) Int. Cl.
*G03F 7/20* (2006.01)
*G03F 1/84* (2012.01)
*G03F 7/00* (2006.01)

(52) U.S. Cl.
CPC ............. *G03F 7/7085* (2013.01); *G03F 1/84* (2013.01); *G03F 7/702* (2013.01); *G03F 7/70033* (2013.01); *G03F 7/70775* (2013.01)

(58) Field of Classification Search
CPC ........ G03F 1/84; G03F 7/70033; G03F 7/702; G03F 7/70666; G03F 7/70775; G03F 7/7085; G03F 7/70483
See application file for complete search history.

(56) References Cited

U.S. PATENT DOCUMENTS

2008/0258070 A1*  10/2008  Scholz ............... H05G 2/00
                                                  250/372
2014/0217298 A1*  8/2014   Wang ................. G03F 1/24
                                                  359/361
(Continued)

FOREIGN PATENT DOCUMENTS

DE   102018216870   4/2020   ............ G03F 7/20
WO   WO 2016/012425  1/2016   ............ G02B 17/08
(Continued)

OTHER PUBLICATIONS

Office Action issued by the German Patent and Trademark Office for Application No. DE 10 2021 213 327.4, dated Apr. 14, 2022 (with English Translation).

*Primary Examiner* — Deoram Persaud
(74) *Attorney, Agent, or Firm* — Fish & Richardson P.C.

(57) ABSTRACT

A metrology system serves for examining objects with EUV measurement light. An illumination optical unit serves for guiding the EUV measurement light towards the object to be examined. The illumination optical unit has an illumination optical unit stop for prescribing a measurement light intensity distribution in an illumination pupil in a pupil plane of the illumination optical unit. An output coupling mirror serves for coupling a part of the measurement light out of an illumination beam path of the illumination optical unit. The output coupling mirror has a mirror surface which is used to couple out measurement light and has an aspect ratio of a greatest mirror surface extent A longitudinally with respect to a mirror surface longitudinal dimension (x) to a smallest mirror surface extent B longitudinally with respect to a mirror surface transverse dimension (y) perpendicular to the mirror surface longitudinal dimension (x). The aspect ratio A/B is greater than 1.1. The result is a metrology system in which a measurement light throughput is optimized even in the simulation or emulation of an imaging optical unit of a (Continued)

projection exposure apparatus having an image-side numerical aperture of greater than 0.5 and in particular in the simulation or emulation of an anamorphic imaging optical unit.

20 Claims, 3 Drawing Sheets

(56) References Cited

U.S. PATENT DOCUMENTS

| | | | |
|---|---|---|---|
| 2015/0009492 A1* | 1/2015 | Frese | G03F 7/706 |
| | | | 356/124 |
| 2017/0131528 A1 | 5/2017 | Ruoff et al. | |
| 2017/0312782 A1 | 5/2017 | Matejka et al. | |
| 2019/0277772 A1 | 9/2019 | Nishizawa et al. | |
| 2019/0331611 A1* | 10/2019 | Ebstein | G02B 21/0016 |
| 2021/0084741 A1* | 3/2021 | Patra | H05G 2/006 |

FOREIGN PATENT DOCUMENTS

| WO | WO 2016/012426 | 1/2016 | G02B 17/08 |
|---|---|---|---|
| WO | WO 2020/069870 | 4/2020 | G03F 7/20 |

* cited by examiner

METROLOGY SYSTEM FOR EXAMINING OBJECTS WITH EUV MEASUREMENT LIGHT

CROSS-REFERENCE TO RELATED APPLICATION

The present patent application claims the priority under 35 U.S.C. § 119 from German patent application DE 10 2021 213 327.4, filed on Nov. 26, 2021, the entire content of which is incorporated herein by reference.

TECHNICAL FIELD

The invention relates to a metrology system for examining objects with EUV measurement light.

BACKGROUND

A metrology system is known from US 2017/0131 528 A1 (parallel document WO 2016/012425 A2), from WO 2016/012426 A1 and from US 2017/0132782 A1. A metrology system of that type can be used to simulate or emulate in particular imaging properties of an EUV projection exposure apparatus.

SUMMARY

It is an aspect of the present invention to develop a metrology system of the type mentioned in the introductory part in a manner such that a measurement light throughput is optimized even in the simulation or emulation of an imaging optical unit of a projection exposure apparatus having an image-side numerical aperture of greater than 0.5 and in particular in the simulation or emulation of an anamorphic imaging optical unit.

According to the invention, this aspect is achieved by a metrology system having the features specified in claim 1.

According to the invention it has been found that the use of an output coupling mirror having an aspect ratio of greater than 1.1 offers the option to design the output coupling of measurement light, which is used regularly for supplying, for example, a monitoring energy sensor of the metrology system, in a manner such that no undesirable shading of measurement light that is otherwise usable for examining objects occurs. The shading caused by the output coupling mirror in that case can be such that it is produced in a region that lies within an obscuration produced by an illumination optical unit stop and/or by an imaging optical unit stop of the metrology system. A peripheral contour of the output coupling mirror having an aspect ratio of greater than 1.1 can in particular be adapted to obscuration areas of pupil-shaping stops having a correspondingly large aspect ratio, with the result that the output coupling mirror does not produce additional pupil shading particularly in the central obscuration.

Depending on the imaging optical unit of a projection exposure apparatus to be simulated or emulated, an aspect ratio according to claim 2 can offer advantages.

The aspect ratio A/B can be greater than 1.3, can be greater than 1.7 and can even be greater than 1.9. As a rule, the aspect ratio A/B is less than 10.

An aspect ratio upper limit according to claim 3 results in an overall compact output coupling mirror with manageable production costs. Even coating such a mirror does not add any undue costs.

Overall, an output coupling mirror having a comparatively large aspect ratio can be designed such that it is also compatible with stops or obscuration areas of further pupil-shaping stops of the metrology system having a smaller aspect ratio. Using the metrology system, it is then possible to simulate or emulate not only projection optical units of projection exposure apparatuses having a high image-side numerical aperture and in particular anamorphic projection optical units, but also isomorphic projection optical units with an in particular smaller image-side numerical aperture. It can then be ensured that no undesired pupil shading due to the output coupling mirror occurs for such other projection optical units.

Rectilinear boundary longitudinal sides according to claim 4 have proven useful in designing the peripheral contour of the mirror surface of the output coupling mirror.

Convexly curved narrow sides of the peripheral contour of the output coupling mirror according to claim 5 enable the use of correspondingly shaped central obscuration areas of pupil-shaping stops that are already used at any rate in the metrology system.

This applies in particular to the design of the narrow sides as ellipse portions according to claim 6.

An output coupling mirror having an output coupling pupil obscuration area according to claim 7 produces no additional central pupil shading in comparison with the illumination optical unit stop.

An output coupling pupil obscuration area of the output coupling mirror according to claim 8 produces no additional central pupil shading in comparison with the imaging optical unit stop.

A metrology system comprising an EUV light source according to claim 9 can be used autonomously. In principle, it is also possible to use the EUV light source in an EUV projection exposure apparatus as a light source for the metrology system.

The metrology system can be used to measure a lithography mask provided for projection exposure for producing semiconductor components with very high structure resolution, which is better than 30 nm, for example, and which can be better than 10 nm, in particular.

BRIEF DESCRIPTION OF DRAWINGS

An exemplary embodiment of the invention is explained in greater detail below with reference to the drawing, in which.

DETAILED DESCRIPTION

Figure 1:
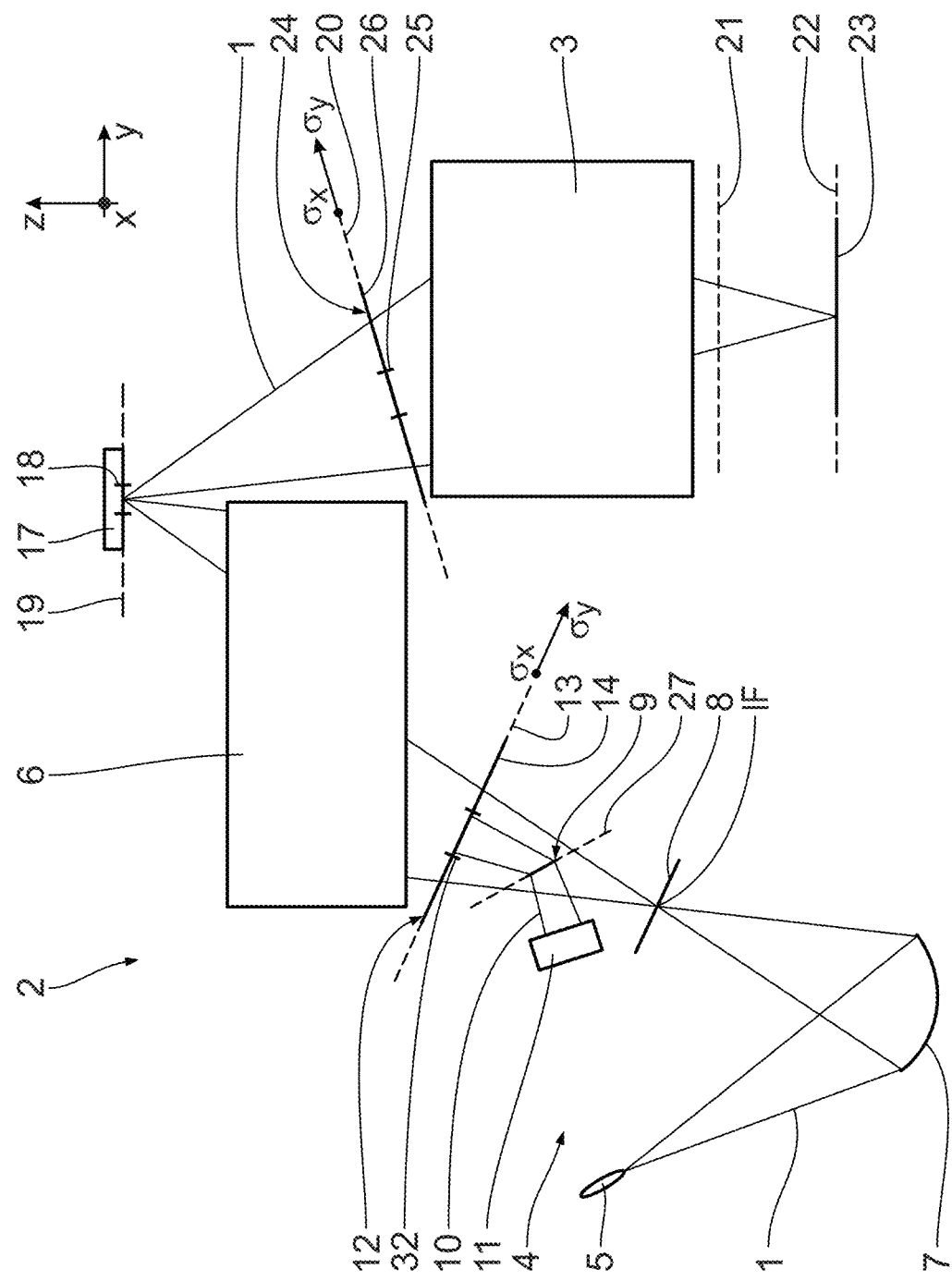
FIG. 1 shows schematically and in a meridional section a metrology system for examining objects with EUV measurement light.

FIG. 1 shows, in a plane corresponding to a meridional section, a beam path of EUV illumination light or EUV imaging light 1 in a metrology system 2 having an imaging optical unit 3. The imaging optical unit 3 is illustrated schematically in FIG. 1. The illumination light 1 is generated in an illumination system 4 of the projection exposure apparatus 2. The illumination light or imaging light 1 is also referred to as measurement light below.

In order to facilitate the representation of positional relationships, a Cartesian xyz-coordinate system will be used hereinafter. The x-axis in FIG. 1 extends perpendicular to the plane of the drawing and out of the latter. The y-axis in FIG. 1 extends towards the right. The z-axis extends upwardly in FIG. 1.

The illumination system 4 includes a schematically illustrated EUV light source 5 and a likewise schematically illustrated illumination optical unit 6. The light source can be, e.g., a laser plasma source (LPP; laser produced plasma) or a discharge source (DPP; discharge produced plasma). In principle, a synchrotron-based light source can also be used, for example a free electron laser (FEL). A used wavelength of the illumination light 1 can lie in the range of between, e.g., 5 nm and 30 nm. In principle, in the case of a variant of the projection exposure apparatus 2, it is also possible to use a light source for another used light wavelength, for example for a used wavelength of 193 nm.

A collector mirror 7 of the illumination system 4 is arranged downstream of the EUV light source 5 in the beam path of the illumination light 1. The collector mirror 7 is designed as an ellipsoidal mirror. A source region of the light source 5 lies in a first focal point of the collector mirror 7. An intermediate focus IF lies in the second focal point of the collector mirror 7 arranged downstream of the collector mirror 7 in the illumination light beam path. The illumination light beam path passes through an intermediate focus stop 8 of the illumination system 4 in the region of the intermediate focus IF.

An output coupling mirror 9 for coupling an output coupling part 10 of the measurement light 1 out of the illumination beam path is arranged downstream of the intermediate focus stop 8 in the illumination light beam path. The output coupling part 10 is coupled out via the output coupling mirror 9 towards an energy sensor 11 of the illumination system. The energy sensor 11 can be a spatially resolving sensor. The energy sensor 11 serves to monitor the performance of the EUV light source 5 and/or of the collector mirror 7 and possibly to monitor a function of the intermediate focus stop 8. A shading effect of the output coupling mirror 9 will be explained in more detail below.

An illumination optical unit stop 12 is arranged downstream of the output coupling mirror 9 in the illumination beam path of the illumination optical unit 6.

The illumination light 1 is conditioned in the illumination optical unit 6 of the illumination system 4 such that a specific illumination setting of the illumination is provided, that is to say a specific illumination angle distribution. Said illumination setting corresponds to a specific intensity distribution of the illumination light 1 in an illumination pupil of the illumination optical unit of the illumination system 4. The illumination optical unit stop 12 arranged in a pupil plane 13 of the illumination optical unit 6 serves to provide the respective illumination setting.

The illumination optical unit stop 12 is held in a stop holder 14, which is indicated merely schematically in FIG. 1. This can be a stop interchange holder which makes possible an interchange of the illumination optical unit stop 12 currently used in the illumination with at least one interchange illumination optical unit stop 12. Such an interchange holder can comprise a cartridge having a plurality of in particular different illumination optical unit stops 12 for prescribing different illumination settings.

The illumination optical unit 6 is located downstream of the illumination optical unit stop 12 in the beam path. The former can have a plurality of mirrors.

The illumination optical unit 6 serves to guide the EUV measurement light 1 with the illumination setting set via the illumination optical unit stop 12 and possibly the illumination optical unit mirrors towards an object 17 to be examined. The object 17 can be a reticle that can be used as a master structure in a projection exposure apparatus for producing structured semiconductor components. An object field 18 in an object plane 19 is illuminated using the illumination system 4. The reticle 17 is also referred to as lithography mask and is arranged such that a portion of the reticle 17 coincides with the object field 18.

The illumination light 1 is reflected by the reticle 17 and enters an entrance pupil of the imaging optical unit 3 in an entrance pupil plane 20.

Within the imaging optical unit 3, the illumination or imaging light 1 propagates between the entrance pupil plane 20 and an exit pupil plane 21. The imaging optical unit 3 can have an anamorphic embodiment and then generates a circular exit pupil from an elliptic entrance pupil, for example.

Two mirrors of the imaging optical unit 3 lie between the entrance pupil plane 20 and the exit pupil plane 21 in the imaging light beam path. A further mirror lies downstream of the exit pupil plane 21 in the imaging light beam path of the imaging optical unit 3. Overall, the imaging optical unit 3 has exactly three mirrors. Depending on the embodiment of the metrology system 1, the imaging optical unit 3 can also have a different number of mirrors between for example two and ten.

The imaging optical unit 3 images the object field 18, that is to say a portion of the object 17, into a measurement plane 22. A spatially resolving detection device 23 in the form of a camera is arranged in the measurement plane 22.

In the embodiment illustrated, an angle between the object plane 19 and the measurement plane 22 differs from 0. Depending on the embodiment, the object plane 19 can also be parallel to the measurement plane 22, and the two planes can in particular coincide.

With the aid of the metrology system 2, in particular an aerial image stack can be captured with the detection device 23. For this purpose, the object 17 can be incrementally displaced in the z-direction.

The imaging optical unit 3 of the metrology system 2 has a magnification that is greater than 50 and can also be greater than 100. As a rule, this magnification is less than 1000. The imaging optical unit 3 consequently leads to magnified imaging of the object field 18 onto an image field in the measurement plane 22, in which in particular a CCD chip or CMOS chip of the detection device 23 can be arranged.

An inference is made based on the recorded aerial image regarding the imaging suitability of structures on the object 17 for a projection optical unit of a projection exposure apparatus which can be used for producing structured semiconductor devices, in particular microchips, for example memory chips.

An imaging optical unit stop 24, which is shown by way of example in the entrance pupil plane 20 in FIG. 1, is arranged at least in one of the pupil planes 20, 21 of the imaging optical unit 3.

The imaging optical unit stop 24 has a central obscuration portion 25 for prescribing an obscuration of an imaging pupil of the imaging optical unit 3, that is to say of the entrance pupil and/or the exit pupil.

The imaging optical unit stop 24 is held in a stop holder 26, which is indicated merely schematically in FIG. 1. This can be a stop interchange holder which makes possible an interchange of the imaging optical unit stop 24 currently used in the imaging with at least one interchange imaging optical unit stop. This can be used for simulating or emulating different imaging optical units of projection exposure apparatuses that are simulated or emulated with the metrology system 2.

Figure 2:
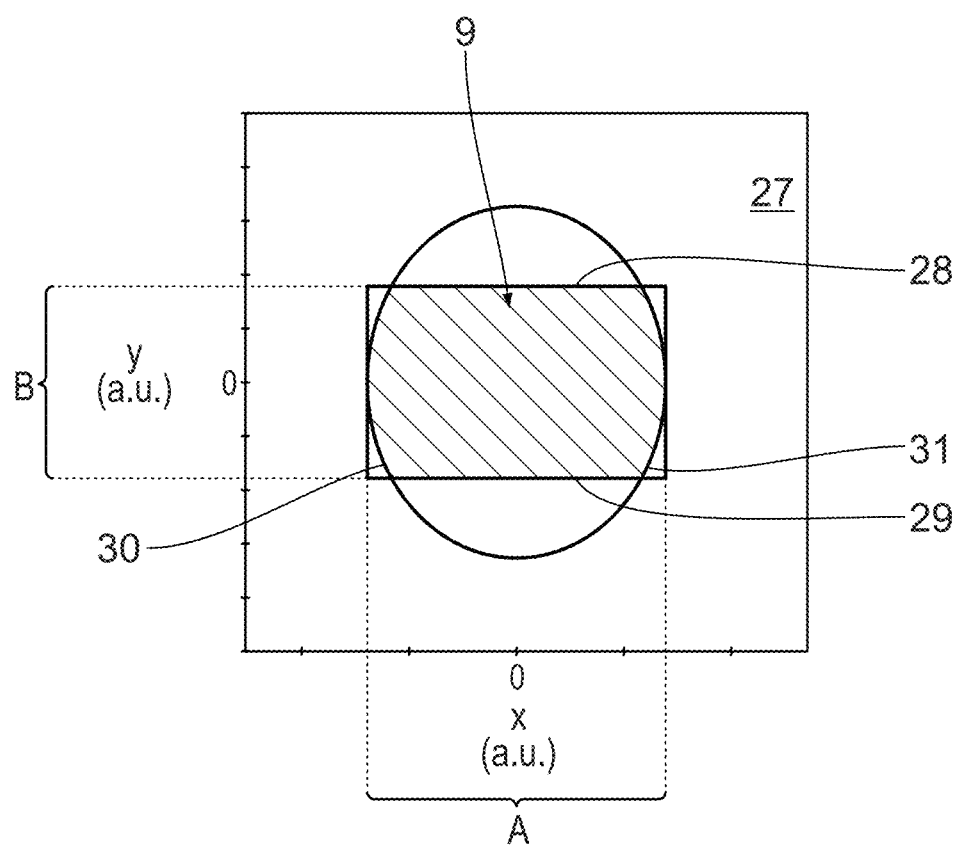
FIG. 2 shows a plan view of an output coupling mirror for coupling part of the EUV measurement light out of an illumination beam path of an illumination optical unit of the metrology system.

FIG. 2 shows a plan view of the output coupling mirror 9. The plane of the drawing of FIG. 2 coincides with a mirror plane 27 (cf. FIG. 1) of the output coupling mirror 9. It shows a mirror surface of the output coupling mirror 9 that is used to couple out measurement light. Said mirror surface has its greatest mirror surface extent A along a mirror surface longitudinal dimension x, which runs parallel to the x-axis of the global Cartesian x-, y-, z-coordinate system of the metrology system 2. The smallest mirror surface extent B of the mirror surface of the output coupling mirror 9 that is used to couple out measurement light extends along a mirror transverse dimension y, which together with the x-axis defines the mirror plane 27 and encloses an angle that differs from 0 with the global y-axis of FIG. 1. This (tilt) angle of the output coupling mirror 9 is approximately 25° with respect to the incident illumination light 1, and so the output coupling partial beam 10 is coupled out of the measurement light beam path at approximately 50°. An aspect ratio of the greatest mirror surface extent A to the smallest mirror surface extent B is greater than 1.1 and can be greater than 1.2, can be greater than 1.3, can be greater than 1.4, and, in the illustrated embodiment, is greater than 1.5, specifically is 1.58.

Longitudinal sides 28, 29 of the mirror surface of the output coupling mirror 9 that are used to couple out measurement light and have between them the distance B are embodied in the form of rectilinear boundaries of the mirror surface.

Narrow sides 30, 31, between which lies the greatest mirror surface extent A of the mirror surface of the output coupling mirror used to couple out measurement light, are designed as convexly curved boundaries of the mirror surface of the output coupling mirror 9. These narrow sides 30, 31 of the output coupling mirror 9 are designed as ellipse portions. For the purposes of clarifying the shape of the mirror surface of the output coupling mirror 9 that is used to couple out measurement light, FIG. 2 shows both a rectangle with the side lengths A and B and also an ellipse with the ellipse portions that form the narrow sides 30, 31 and into which a peripheral contour of the mirror surface of the output coupling mirror 9 that is used to couple measurement light is inscribed.

The illumination optical unit stop 12 has an obscuration portion 32, via which a central shading of the illumination light 1 in the illumination optical unit pupil plane 13 is produced.

Figure 3:
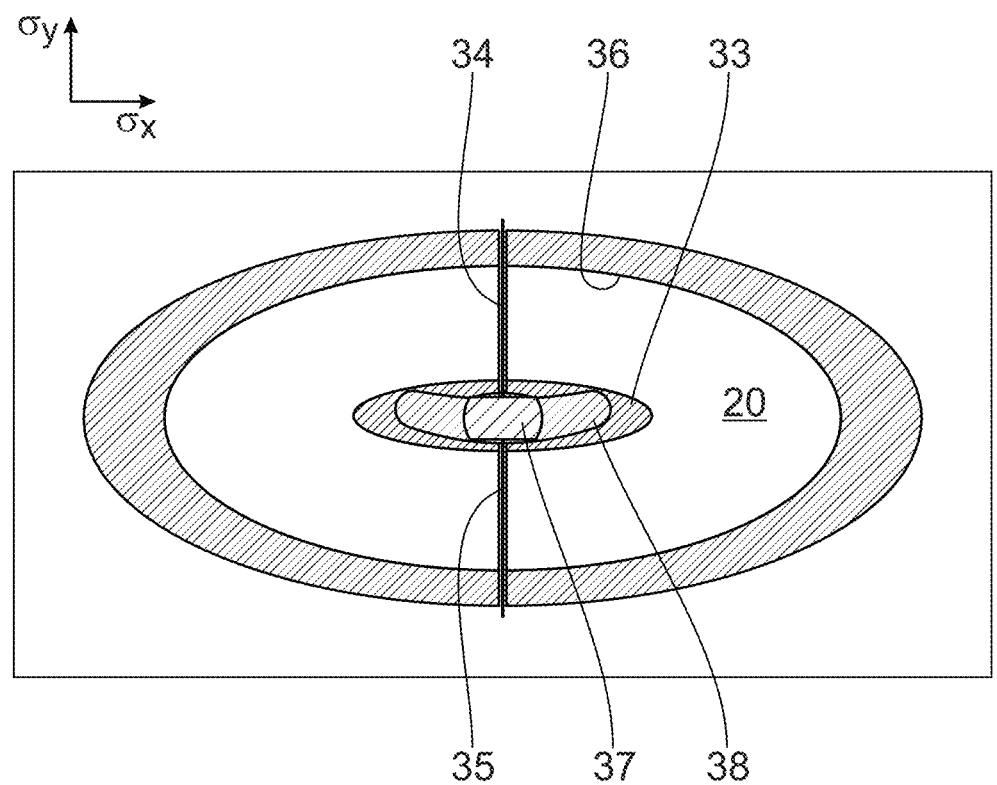
FIG. 3 shows a plan view of an imaging pupil of an imaging optical unit of the metrology system, wherein a pupil-shading effect of the output coupling mirror, a pupil-shading effect of an illumination optical unit stop for prescribing a measurement light intensity distribution in an illumination pupil of the illumination optical unit and of an imaging optical unit stop with an obscuration portion for prescribing an obscuration of the imaging pupil are illustrated.

FIG. 3 illustrates the pupil-shading effects of the output coupling mirror 9, of the illumination optical unit stop 12 and of the output coupling optical unit stop 24 in the entrance pupil plane 20. The entrance pupil is defined in this entrance pupil plane 20 by pupil coordinates $\sigma_x$ and $\sigma_y$. The pupil coordinate $\sigma_x$ runs parallel to the x-coordinate of the global coordinate system of FIG. 1.

A central illumination optical unit stop obscuration area 33, which is produced by the shading effect of the obscuration portion 32, has a substantially elliptical peripheral contour in the shape of a lying ellipse. In addition, FIG. 3 shows pupil shadows 34, 35 of fastening webs of the obscuration portion 32 of the illumination optical unit stop 12 that run longitudinally with respect to the $\sigma_y$-pupil coordinate.

FIG. 3 furthermore shows an outer illumination aperture 36, again elliptical, which is likewise prescribed by the illumination optical unit stop 12. Aside from the pupil shadows 34, 35 of the webs, the measurement light 1 can pass unimpeded through the entrance pupil plane 20 between the illumination optical unit stop obscuration area 33 and the illumination aperture 36.

A central shading, which is illustrated in FIG. 3 as an output coupling pupil obscuration area 37, is produced by the output coupling mirror 9 in the pupil plane 13 and also in the entrance pupil plane 20 of the imaging optical unit 3 that is conjugate thereto. Beside this central output coupling pupil obscuration area 37, holding webs of the output coupling mirror 9 in turn produce pupil shadows that lie within the pupil shadows 34, 35. The shape of the central output coupling pupil obscuration area 37 is similar to the peripheral contour of the mirror surface of the output coupling mirror 9 used to couple out measurement light (cf. FIG. 2).

The output coupling pupil obscuration area 37 lies within the illumination optical unit stop obscuration area 33, with the result that the output coupling pupil obscuration area 37 causes no additional shading of the measurement light 1 within the entrance pupil plane 20.

FIG. 3 furthermore shows a pupil-shading effect of the imaging optical unit stop 24, specifically a central imaging optical unit stop obscuration area 38 produced by the shading due to the obscuration portion 25 of the imaging optical unit stop 24 and also pupil shadows of holding webs of the imaging optical unit stop 24, which again lie within the pupil shadows 34, 35.

The output coupling pupil obscuration area 37 lies within the imaging optical unit stop obscuration area 38, with the result that the output coupling mirror 9 does not produce any additional shading effects for the measurement light 1 in the entrance pupil plane 20 even with reference to the imaging optical unit stop 24.

Depending on the embodiment of the output coupling mirror 9, its shading effect longitudinally with respect to the $\sigma_y$-extent can also be greater than a $\sigma_y$-extent of the imaging optical unit stop obscuration area 38, as long as the output coupling mirror 9 produces no additional shading in the entrance pupil plane 20 in comparison with the illumination optical unit stop 12.

Figure 4:
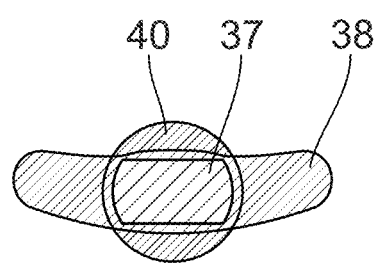
FIG. 4 shows a plan view similar to FIG. 3 in respect of the illustration of a central obscuration, wherein a pupil-shading effect of an alternative illumination optical unit stop in addition to the shading effects of the output coupling mirror and of the imaging optical unit stop are shown.

FIG. 4 shows, in a shape similar to FIG. 3 with respect to the illustration of the central obscuration, a shading effect when using an alternative illumination optical unit stop producing a circular central illumination optical unit stop obscuration area 40. The shapes of the output coupling pupil obscuration area 37 and of the imaging optical unit stop obscuration area 38 correspond to those which were explained above with reference to FIG. 3. The output coupling pupil obscuration area 37 lies again entirely within the illumination optical unit stop obscuration area 40.

The alternative illumination optical unit stop, which produces the illumination optical unit stop obscuration area 40 according to FIG. 4, can be used for the corresponding simulation or emulation of an in particular isomorphic optical unit.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while optical components may be described in a particular order along an optical path, this should not be understood as requiring that such optical components be arranged in the particular order described or in sequential order, or that all described optical components be used, to achieve desirable results. Moreover, the separation of various system components in the embodiments described above should not be understood as requiring such separation in all embodiments.

Thus, particular embodiments of the invention have been described. Other embodiments are within the scope of the following claims.

What is claimed is:

1. A metrology system for examining objects with EUV measurement light,
   comprising an illumination optical unit for guiding the EUV measurement light towards the object to be examined, having an illumination optical unit stop for setting a measurement light intensity distribution in an illumination pupil in a pupil plane of the illumination optical unit,
   comprising an output coupling mirror for coupling a part of the measurement light out of an illumination beam path of the illumination optical unit,
   wherein the output coupling mirror has a mirror surface which is used to couple out measurement light and has an aspect ratio of a greatest mirror surface extent A along a mirror surface longitudinal dimension (x) to a smallest mirror surface extent B along a mirror surface transverse dimension (y) perpendicular to the mirror surface longitudinal dimension (x), wherein the aspect ratio A/B is greater than 1.1.

2. The metrology system of claim 1, wherein the aspect ratio A/B is greater than 1.5.

3. The metrology system of claim 2, wherein the aspect ratio A/B is 2 at most.

4. The metrology system of claim 2, wherein longitudinal sides of the output coupling mirror, which have between them the distance B of the smallest mirror surface extent, are embodied in the form of rectilinear boundaries of the mirror surface.

5. The metrology system of claim 2, wherein narrow sides of the output coupling mirror, which have between them the largest mirror surface extent A, are embodied in the form of convexly curved boundaries of the mirror surface.

6. The metrology system of claim 2, wherein an output coupling pupil obscuration area produced by a shading of the illumination beam path caused by the output coupling mirror in a downstream pupil plane of the metrology system lies within an illumination optical unit stop obscuration area produced by an obscuration portion of the illumination optical unit stop in the pupil plane.

7. The metrology system of claim 2, comprising an imaging optical unit for imaging a portion of the object into a measurement plane, having an imaging optical unit stop with an obscuration portion for prescribing an obscuration of an imaging pupil in a pupil plane of the imaging optical unit, wherein an output coupling pupil obscuration area produced by a shading of the illumination beam path caused by the output coupling mirror in the pupil plane lies within an imaging optical unit stop obscuration area produced by the obscuration portion of the imaging optical unit stop.

8. The metrology system of claim 1, wherein longitudinal sides of the output coupling mirror, which have between them the distance B of the smallest mirror surface extent, are embodied in the form of rectilinear boundaries of the mirror surface.

9. The metrology system of claim 1, wherein narrow sides of the output coupling mirror, which have between them the largest mirror surface extent A, are embodied in the form of convexly curved boundaries of the mirror surface.

10. The metrology system of claim 9, wherein the narrow sides of the output coupling mirror have peripheral contours in the shape of ellipse portions.

11. The metrology system of claim 1, wherein an output coupling pupil obscuration area produced by a shading of the illumination beam path caused by the output coupling mirror in a downstream pupil plane of the metrology system lies within an illumination optical unit stop obscuration area produced by an obscuration portion of the illumination optical unit stop in the pupil plane.

12. The metrology system of claim 1, comprising an imaging optical unit for imaging a portion of the object into a measurement plane, having an imaging optical unit stop with an obscuration portion for prescribing an obscuration of an imaging pupil in a pupil plane of the imaging optical unit, wherein an output coupling pupil obscuration area produced by a shading of the illumination beam path caused by the output coupling mirror in the pupil plane lies within an imaging optical unit stop obscuration area produced by the obscuration portion of the imaging optical unit stop.

13. The metrology system of claim 12, wherein the imaging optical unit comprises an anamorphic imaging optical unit that is configured to produce a circular exit pupil from an elliptic entrance pupil.

14. The metrology system of claim 1, comprising an EUV light source for producing the EUV measurement light.

15. A system comprising:
   an illumination optical unit configured to guide EUV measurement light towards an object to be examined, the illumination optical unit comprising an illumination optical unit stop for setting a measurement light intensity distribution in an illumination pupil in a pupil plane of the illumination optical unit; and
   an output coupling mirror configured to couple a portion of the EUV measurement light out of an illumination beam path of the illumination optical unit;
   wherein the output coupling mirror has a mirror surface that is used to couple out measurement light and has an aspect ratio of a greatest mirror surface extent A along a mirror surface longitudinal dimension (x) to a smallest mirror surface extent B along a mirror surface transverse dimension (y) perpendicular to the mirror surface longitudinal dimension (x), the aspect ratio A/B is greater than 1.1.

16. The system of claim 15, wherein the aspect ratio A/B is greater than 1.5.

17. The system of claim 15, wherein narrow sides of the output coupling mirror, which have between them the largest mirror surface extent A, are embodied in the form of convexly curved boundaries of the mirror surface.

18. The system of claim 15, wherein an output coupling pupil obscuration area produced by a shading of the illumination beam path caused by the output coupling mirror in a downstream pupil plane of the metrology system lies within an illumination optical unit stop obscuration area produced by an obscuration portion of the illumination optical unit stop in the pupil plane.

19. The system of claim 15, comprising an imaging optical unit for imaging a portion of the object into a measurement plane, having an imaging optical unit stop with an obscuration portion for prescribing an obscuration of an imaging pupil in a pupil plane of the imaging optical unit, wherein an output coupling pupil obscuration area produced by a shading of the illumination beam path caused by the output coupling mirror in the pupil plane lies within an imaging optical unit stop obscuration area produced by the obscuration portion of the imaging optical unit stop.

20. The system of claim 19, wherein the imaging optical unit comprises an anamorphic imaging optical unit that is configured to produce a circular exit pupil from an elliptic entrance pupil.

* * * * *